US005367213A

United States Patent [19]

Casper

[11] Patent Number: 5,367,213
[45] Date of Patent: Nov. 22, 1994

[54] P-CHANNEL SENSE AMPLIFIER PULL-UP CIRCUIT INCORPORATING A VOLTAGE COMPARATOR FOR USE IN DRAM MEMORIES HAVING NON-BOOTSTRAPPED WORD LINES

[75] Inventor: Stephen L. Casper, Boise, Id.

[73] Assignee: Micron Semiconductor, Inc., Boise, Id.

[21] Appl. No.: 75,200

[22] Filed: Jun. 9, 1993

[51] Int. Cl.$^5$ .............................................. G11C 7/06
[52] U.S. Cl. .................................. 327/56; 365/189.11; 327/77; 327/530
[58] Field of Search ................... 307/530, 296.3, 296.1, 307/577, 572, 350, 354; 365/189.11, 194, 227, 229

[56] References Cited

U.S. PATENT DOCUMENTS

| | | | |
|---|---|---|---|
| 4,723,225 | 2/1988 | Kaszubinski et al. | 365/203 |
| 5,122,986 | 6/1992 | Lim | 365/189.11 |
| 5,175,451 | 12/1992 | Ihara | 307/530 |
| 5,250,854 | 10/1993 | Lien | 307/296.1 |
| 5,253,201 | 10/1993 | Atsumi et al. | 365/189.11 |

Primary Examiner—Timothy P. Callahan
Assistant Examiner—T. T. Lam
Attorney, Agent, or Firm—Angus C. Fox, III

[57] ABSTRACT

This invention is an improved pull-up circuit for P-channel sense amplifiers in dynamic random access memory arrays having non-bootstrapped wordlines. The improved pull-up circuit features a voltage-comparator-controlled P-channel device which couples the power supply bus to a pull-up node for high current flow to the node and to digit lines which are coupled to the node via P-channel isolation devices. During the pull-up cycle, the P-channel device remains "on" as long as a reference voltage is greater than a variable voltage which represents the voltage level on portions of the digit lines farthest from the P-channel sense amplifier. The pull-up circuit also has an N-channel device which couples the power supply node to the pull-up node for maintenance of a desired voltage level equal to $V_{cc}$ minus the threshold voltage of the N-channel device.

7 Claims, 3 Drawing Sheets

P-CHANNEL SENSE AMPLIFIER PULL-UP CIRCUIT INCORPORATING A VOLTAGE COMPARATOR FOR USE IN DRAM MEMORIES HAVING NON-BOOTSTRAPPED WORD LINES

FIELD OF THE INVENTION

This invention generally relates to pull-up circuits for P-channel sense amplifiers used in dynamic memory arrays, and more particularly to a pull-up circuit for use in a DRAM array having non-bootstrapped wordlines, the pull-up circuit having a voltage-comparator-controlled P-channel device which couples the power supply bus to a pull-up node for high current flow to the node, and also an N-channel device which couples the power supply node to the pull-up node for maintenance of a desired voltage level.

BACKGROUND OF THE INVENTION

Referring now to FIG. 1, in a dynamic random access memory array having a folded bitline architecture, a plurality of rowlines, RL1-RL4, intersect a plurality of bitline pairs, BL1-BL2 and BL3-BL4. The intersection of each rowline and each bitline provides a memory cell location, and represents a uniquely addressable data bit. During a read operation, when the charge stored in a cell, MC1-MC8, is dumped to a one bitline of a bitline pair by activating the rowline associated with that cell, the other bitline of the bitline pair provides a reference voltage level. Each bitline pair has associated therewith both a P-channel sense amplifier that is responsible for pulling the bitline having the marginally higher voltage level up to a voltage level close to power supply voltage, and an N-channel sense amplifier that is responsible for pulling the bitline having the marginally lower voltage level down to a voltage level close to ground potential.

Since the maximum voltage than can be written to a DRAM cell ($V_M$) is equal to the voltage applied to wordlines $V_{WL}$ minus a threshold voltage ($V_t$), $V_M$ is the optimum voltage level to which bitlines should be pulled up by the P-channel sense amplifiers. In the interest of longer refresh periods, lower soft error rate, and more robust capability to distinguish between a stored "0", and a stored "1" it has been found useful to apply a voltage to the wordlines that is greater than the power supply voltage $V_{CC}$ so that full power supply voltage can be written to a cell to represent a "1" value. U.S. Pat. Nos. 4,543,500 and 4,533,843, both of which issued to Joseph C. McAlexander, III, et al. describe such a technique. In fact, the voltage applied to the wordlines is typically considerably greater than a $V_t$ amount above $V_{CC}$, as this permits much faster voltage transitions. This is due to the fact that current flow through the access transistor ramps down rapidly as the voltage on the bitline approaches a $V_t$ amount below the wordline voltage.

Referring once again to FIG. 1, the DRAM array depicted therein has non-bootstrapped wordlines (i.e., $V_{WL}$ is equal to the power supply voltage) and a prior art pull-up circuit for P-channel sense amplifiers. For such an array, $V_M$ is, of course, equal to $V_{CC}-V_t$. It will be noted that each digit line pair DL1-DL2 and DL3-DL4 in this DRAM array is shared by two memory sub-arrays, SA1 and SA2, with each digitline pair having a single P-channel sense amplifier, PS1 and PS2 located at one end of the digit line pair, and a single N-channel sense amplifier, NS1 and NS2, located between the two subarrays. Each P-channel sense amplifier (PS1 and PS2) is coupled to the pull-up node $P_{VT}$ through a P-channel write device (PW1 and PW2, respectively). Each P-channel write device is controlled by signal WT. Each N-channel sense amplifier (NS1 and NS2), on the other hand, is coupled to ground through an N-channel coupling transistor, NC1 and NC2, which are controlled by signal NLAT.

Still referring to FIG. 1, each sub-array is isolable from the N-channel sense amplifier by means of a natural N-channel isolation device in each digit line, ISO1-ISO8. Each digit line in a digit line pair is coupled to separate input/output lines, IO1 and IO2. The input-/output lines IO1 and IO2 are coupled to multiplexers MUX1 and MUX2, respectively. By having two subarrays share a digit line pair, and by activating only one pair of isolation devices so that only the sub-array being addressed is coupled to the N-channel sense amplifier during sensing operations performed by the N-channel amplifier, digit line capacitance may be effectively halved. Once an N-channel sense amplifier has begun to pull one of its associated digit lines to ground potential, the remaining pair of isolation devices is activated in order to (in the case of the lower array) couple the digit lines to the P-channel sense amplifier, and (in the case of the upper array) couple the digit lines to the N-channel column decode transistors DQ1-DQ4. The column decode transistors are activated by a column decoder, CD, which is coupled to the address buss AB.

Problems With the Prior Art

Still referring to FIG. 1, it will be further noted that a natural device QNA is placed between a P-channel active pull-up device QP and the pull-up node $P_{VT}$. The natural device QNA limits the pull-up voltage on node $P_{VT}$ to $V_{CC}$ minus the $V_t$ of the natural device QNA, which is approximately 0.6 volts. Were it not for the natural device QNA, the $P_{VT}$ node would be pulled up to a full $V_{CC}$, as would be the digit lines within the upper sub-array SA1. However, since the natural N-channel sense amplifier isolation devices between the two sub-arrays ISO1–IS04 would drop this voltage to $V_{CC}$ minus 0.6 volts, performance of the upper and lower sub-arrays would not be well balanced. N-channel cell access devices QN1–QN8 typically have a $V_t$ of about 1.6 volt, and although it would be ideal, in one sense, to have the same $V_t$ drop in the pull-up circuit, the use of an N-channel device having a $V_t$ of 1.6 volt would increase pull-up times dramatically. Thus, the use of the natural device QNA in the pull-up circuit is a compromise between the need for speed and the need to achieve operational voltage balance.

Most significantly, the architecture of FIG. 1 is characterized by slow pull-up times, particularly for the portions of the digit lines within the lower sub-array SA2. FIG. 2 graphically represents the pull-up voltages as a function of time. Plot A represents the voltage on the $P_{VT}$ node; plot B represents the voltage on portions of the digit lines within the upper sub-array SA1; and plot C represents the voltage on portions of the digit lines within the lower sub-array SA2.

What is needed is a new pull-up circuit for P-channel sense amplifiers, in a DRAM array having unbooted word lines, that will decrease the time required to pull up the voltage on all portions of the digit lines to $V_M$.

SUMMARY OF THE INVENTION

This invention is an improved pull-up circuit for P-channel sense amplifiers in dynamic random access memory arrays having non-bootstrapped wordlines. The improved pull-up circuit features a voltage-comparator-controlled P-channel pull-up device which couples the power supply bus to a pull-up node for high current flow to the node and to digit lines which are coupled to the node via P-channel isolation devices. During the pull-up cycle, the P-channel pull-up device remains "on" as long as a reference voltage is greater than a variable voltage which represents the voltage level on portions of the digit lines farthest from the P-channel sense amplifier. The pull-up circuit also has an N-channel pull-up device which couples the power supply node to the pull-up node for maintenance of a desired voltage level equal to $V_{CC}$ minus the threshold voltage of the N-channel pull-up device.

Figure 1:
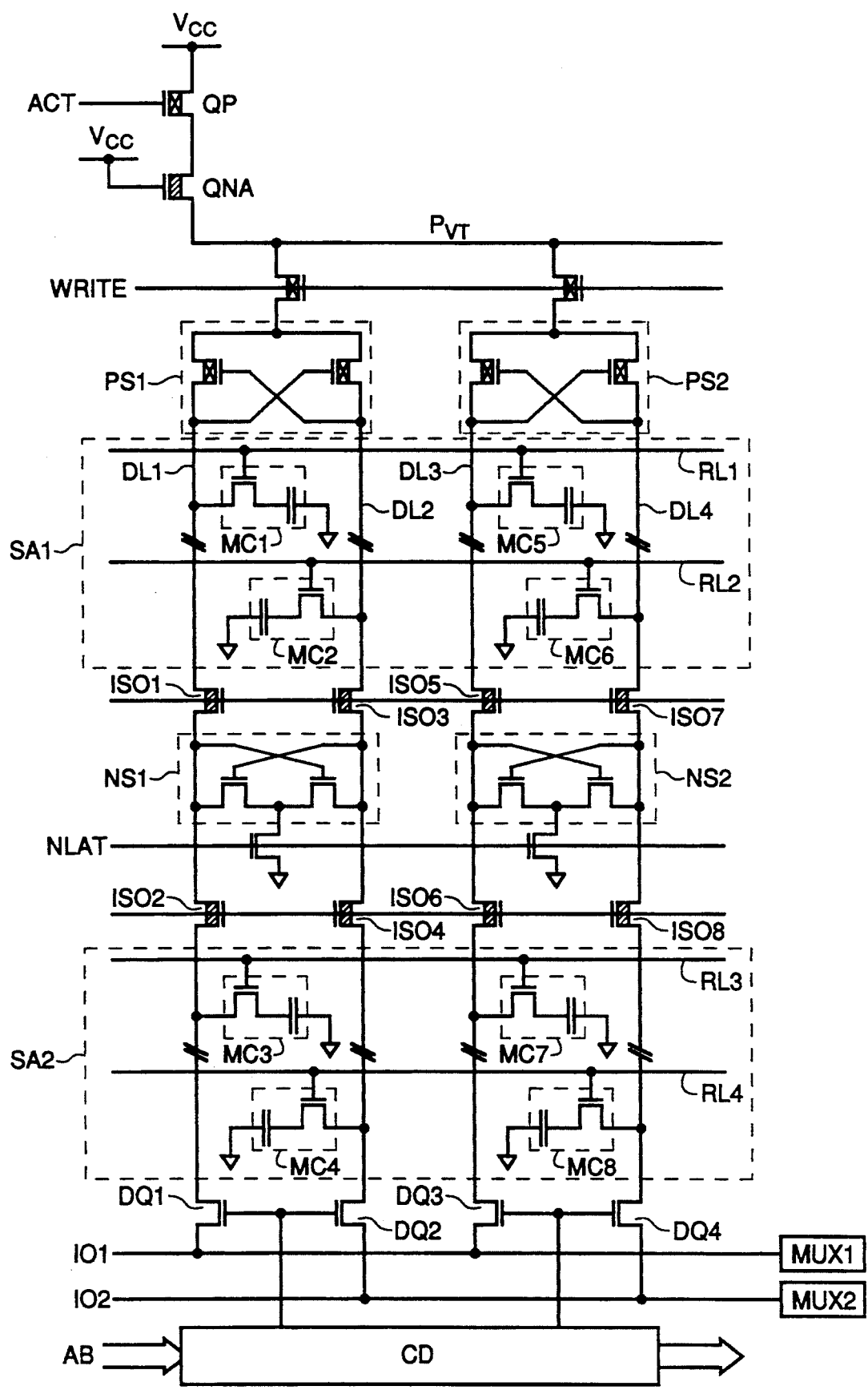
FIG. 1 is a partial circuit diagram of a DRAM memory having unbooted word lines and a prior art P-channel sense amplifier pull-up circuit.

It should be noted that the drawings and graphs used to illustrate the invention are not to scale. They are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE INVENTION

Figure 3:
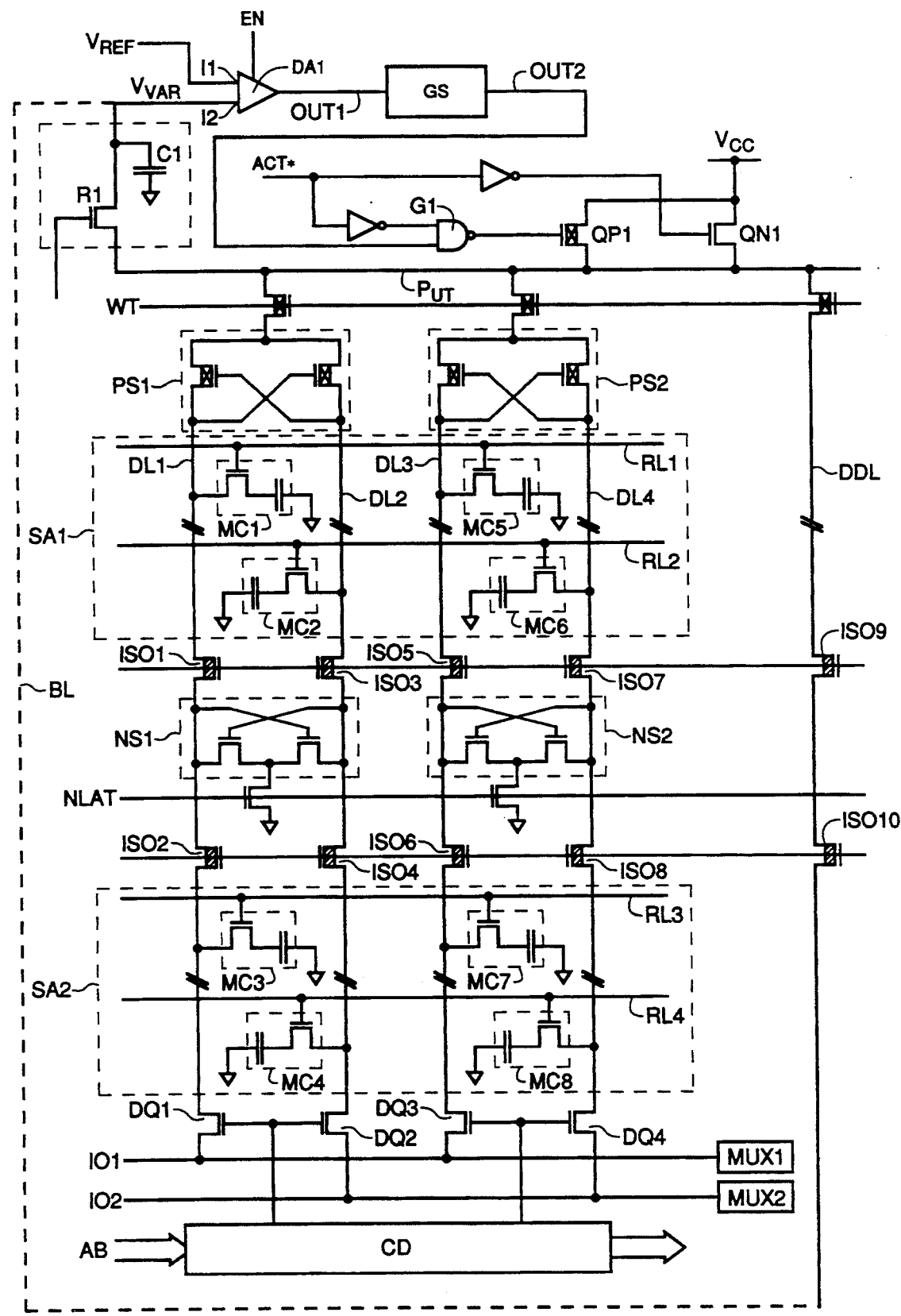
FIG. 3 is a partial circuit diagram of a DRAM array having unbooted word lines and the new P-channel sense amplifier pull-up circuit.

Referring now to FIG. 3, the prior art pull-up circuit shown in FIG. 1 has been replaced with the new pull-up circuit in FIG. 3. The new pull-up circuit has both a P-channel pull-up device QP1 which is controlled by a voltage reference during the pull-up period for rapid charging of a pull-up node, and an N-channel pull-up device QN1 which is "on" during the entire pull-up period for maintaining the desired pull-up voltage level. An on-chip reference voltage $V_{REF}$ is constructed from one of many available techniques, such as a diode ladder, a pair of resistors, etc. The reference voltage provides the first of a pair of inputs to a differential amplifier DA1. The second input to differential amplifier DA1 is a variable voltage $V_{VAR}$, that is designed to represent the voltage level on the digit lines in the lower sub-array SA2. $V_{VAR}$ can be produced in one of several ways. On way is to measure the voltage on the $P_{VT}$ node through an intervening series resistance R1 and parallel capacitance C1, which act to alter the voltage level on the $P_{VT}$ node so that it approximates that on the digit lines in the lower sub-array SA2. A more accurate, but less space-efficient method is to provide an extra non-functional or "dummy" digit line DDL within the memory array, and utilize a voltage take-off from that portion of the dummy digit line within the lower sub-array as the second input to the differential amplifier DA1. The alternate $V_{VAR}$ input (from the dummy digit line DDL) to the second input of the differential amplifier DA1 is represented with a broken line BL. The differential amplifier DA1 is enabled through input EN only during periods of active pull-up. The differential amplifier DA1 is wired such that the output thereof OUT1 will flip from a positive to a negative value when the second input I2 becomes greater than the first input I1. The differential amplifier output OUT1 is fed to a gain stage GS, which may consist of a combination of additional differential amplifiers and/or inverters. The function of the gain stage GS is to convert the differential amplifier output OUT1 to a CMOS logic level.

Still referring to FIG. 3, the output of the gain stage OUT2 is fed to one of the inputs of a NAND gate G1. In addition, an active pull-up control signal ACT, (the asterisk implies that the signal is active when in a low logic state) is inverted before being coupled to another of the inputs of the NAND gate G1. The output of the NAND gate G1 is coupled to the gate of the P-channel pull-up field-effect transistor QP1, the channel of which couples the power supply bus to the node $P_{VT}$ when the voltage on the gate of QP1 is a logic "0". The complement of control signal ACT, is coupled to the gate of N-channel pull-up field-effect transistor QN1, the channel of which also couples the power supply bus to the node $P_{VT}$ during periods when ACT* is low.

Figure 2:
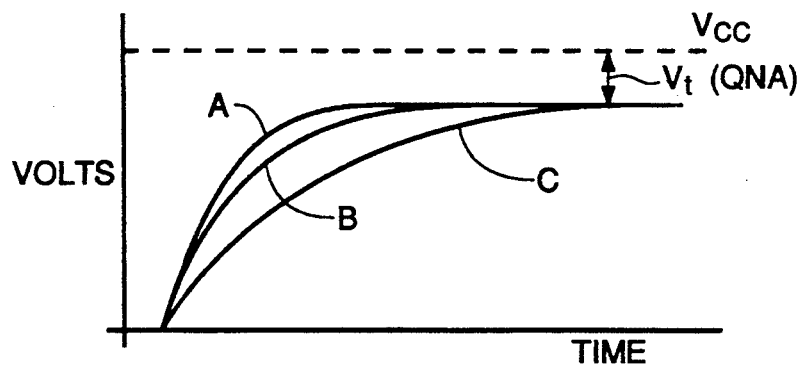
FIG. 2 is a graph of the voltage level on the $P_{VT}$ node, the portions of the digit lines within the upper sub-array, and the portions of the digit lines within the lower sub-array as a function of time for the prior art pull-up circuitry depicted in the DRAM array of FIG. 1.
Figure 4:
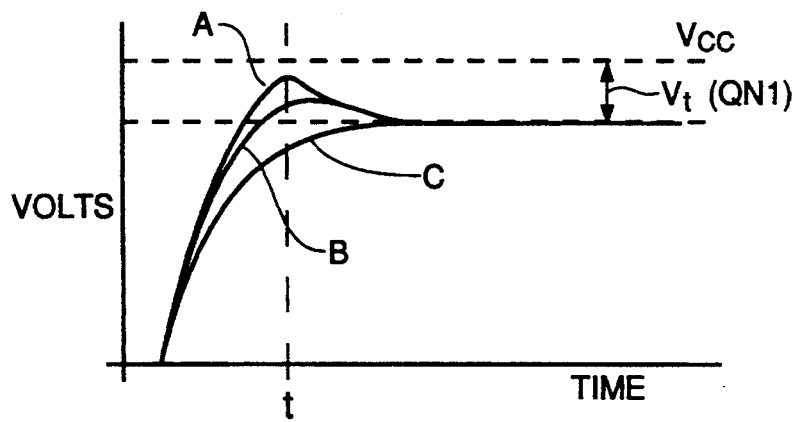
FIG. 4 is a graph of the voltage level on the $P_{VT}$ node, the portions of the digit lines within the upper sub-array, and the portions of the digit lines within the lower sub-array as a function of time for the new pull-up circuitry depicted in the DRAM array of FIG. 1.

FIG. 4 is similar to FIG. 2, except that the plots represent voltages as a function of time for the new pull-up circuit. The reference voltage $V_{REF}$ is set to a value that represents the approximate voltage on those portions of the digit lines within the lower sub-array SA2 at the moment (t) when an amount of charge has been transferred from the power supply bus to the pull-up node $P_{VT}$ and to the portions of the digit lines in the upper sub-array SA1 that is sufficient to provide an overall voltage level on the $P_{VT}$ node and on all portions of the digit lines of $V_{CC}$ minus the $V_t$ of transistor QN1 once equilibrium has been established. Thus, transistor QP1 is turned off before equilibrium is reached, and at a time when both node $P_{VT}$ and the digit lines in the upper sub-array are charged to voltage levels in excess of $V_{CC}-V_t$. After transistor QP1 is turned off, some of the charge on node $P_{VT}$ and on the digit lines in the upper sub-array is transferred to the digit lines in the lower sub-array, resulting in an equilibrium voltage value that is equal to $V_{CC}-V_t$. Thus, the function of transistor QP1 is primarily to rapidly charge node $P_{VT}$, while the function of transistor QN1 is primarily to maintain the equilibrium voltage level by offsetting the effect of leakage. The improved pull-up circuit also improves operational balance, as the $V_t$ of transistor QN1 is approximately 1.0 volt. Thus the equilibrium pull-up voltage on the digit lines is $V_{CC}-1.0$ volt rather than $V_{CC}-0.6$ volts, which is closer to $V_{CC}-1.6$ volts (the approximate $V_t$ of cell access devices). Although it would be possible to turn on the N-channel pull-up transistor QN1 as the P-channel pull-up transistor QP1 is being turned off, this is not a preferred embodiment of the invention, as circuit complexity would be increased and pull-up times would be extended somewhat. Nevertheless, such an embodiment should be considered equivalent, though inferior.

While the invention has been taught with specific reference to the illustrative embodiments, it will be obvious to those having ordinary skill in the art of dynamic random access memory circuit design that changes can be made in form and detail without departing from the spirit and scope of the invention. The described embodiments are to be considered in all respects only as illustrative and not restrictive. The scope of the invention is, therefore, indicated by the appended claims rather than by the foregoing descriptions. All changes which come within the meaning and range of equivalency of the claims are to be embraced within their scope.

I claim:

1. A pull-up circuit for P-channel sense amplifiers in a dynamic random access memory array having non-bootstrapped word lines, said circuit comprising:
   a pull-up node coupled to the P-channel sense amplifiers, said P-channel sense amplifiers being coupled to digit lines within said array;
   a power supply bus;
   a reference voltage;
   a variable voltage;
   a logic gate;
   a differential amplifier for comparing said reference voltage to said variable voltage, said differential amplifier having an output that is coupled to a first input of said logic gate, said logic gate also having a second input for receiving an active pull-up control signal or the complement thereof, said logic gate also having an output;
   at least one P-channel field effect transistor, the gate of which is coupled to the output of said logic gate, and the channel of which couples said power supply bus to said pull-up node during the active pull-up cycle whenever said variable voltage is less than said reference voltage; and
   at least one N-channel field effect transistor, the channel of which couples said power supply bus to said pull-up node during the active pull-up cycle at least during periods that the channel of said P-channel transistor does not couple the power supply bus to said pull-up node.

2. The pull-circuit of claim 1, wherein the gate of said N-channel transistor is controlled by the active pull-up control signal, or the complement thereof, such that the channel of said N-channel transistor couples the power supply bus to said pull-node during the entire active pull-up cycle.

3. The pull-up circuit of claim 2, wherein said logic gate is a NAND gate.

4. The pull-up circuit of claim 1, wherein said variable voltage represents the voltage on portions of digit lines farthest from the P-channel sense amplifiers.

5. The pull-up circuit of claim 4, wherein said variable voltage is a derivative of a voltage level on the pull-up node.

6. The pull-up circuit of claim 5, wherein the voltage level on the pull-up node is passed through series resistance and a parallel capacitance to produce said variable voltage.

7. The pull-up circuit of claim 4, wherein said variable voltage is taken directly from a dummy digit line within the array which is not used for read and write operations.

* * * * *